United States Patent [19]

Maegawa et al.

[11] 4,027,295
[45] May 31, 1977

[54] MAGNETIC BUBBLE DEVICE

[75] Inventors: Harumi Maegawa, Kawasaki; Junzo Matsuda, Tokyo, both of Japan

[73] Assignee: Fujitsu Ltd., Kawasaki, Japan

[22] Filed: Nov. 29, 1974

[21] Appl. No.: 528,504

[30] Foreign Application Priority Data

Dec. 1, 1973 Japan .................... 48-135523

[52] U.S. Cl. .................. 340/174 TF; 340/174 S
[51] Int. Cl.² ............................. G11C 19/08
[58] Field of Search ........... 340/174 TF, 174 MA, 340/174 SR, 174 S; 336/188, 200, 225

[56] References Cited

UNITED STATES PATENTS 3,836,896  9/1974  Rifkin .................. 340/174 TF
3,848,209  11/1974  Lee et al. .................. 340/174 TF

OTHER PUBLICATIONS

IEEE Transactions on Magnetics – vol. Mg.–10, No. 3, Sept. 1974, pp. 753–756.
IEEE Transactions on Magnetics – vol. Mag. – 11; No. 5, Sept. 1975, pp. 1151–1153.
IBM Technical Disclosure Bulletin, vol. 15, No. 6, Nov. 1972, pp. 2001–2002.
IBM Technical Disclosure Bulletin, vol. 16, No. 7, Dec. 1973, pp. 2129–2130.
IEEE Transactions on Magnetics, vol. Mag.–9, No. 3, Sept. 1973, pp. 425–429.
IBMTDB, "Magnetic Domain Device Package," by Bogholtz, et al., vol. 15, No. 6, 11/72.

Primary Examiner—James W. Moffitt
Attorney, Agent, or Firm—Daniel Jay Tick

[57] ABSTRACT

A magnetic bubble device has a flat faced drive coil consisting of electrically conductive material having flat windings. The magnetic bubble chip of the device is positioned in the magnetic field produced by the flat faced coil.

2 Claims, 34 Drawing Figures

FLAT FACED
COIL 81

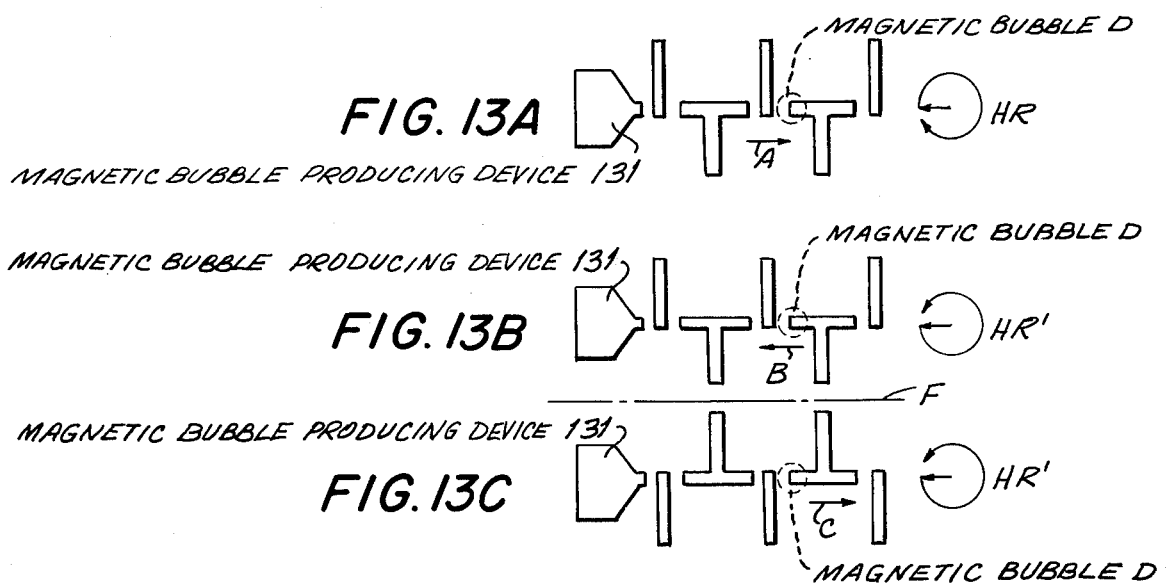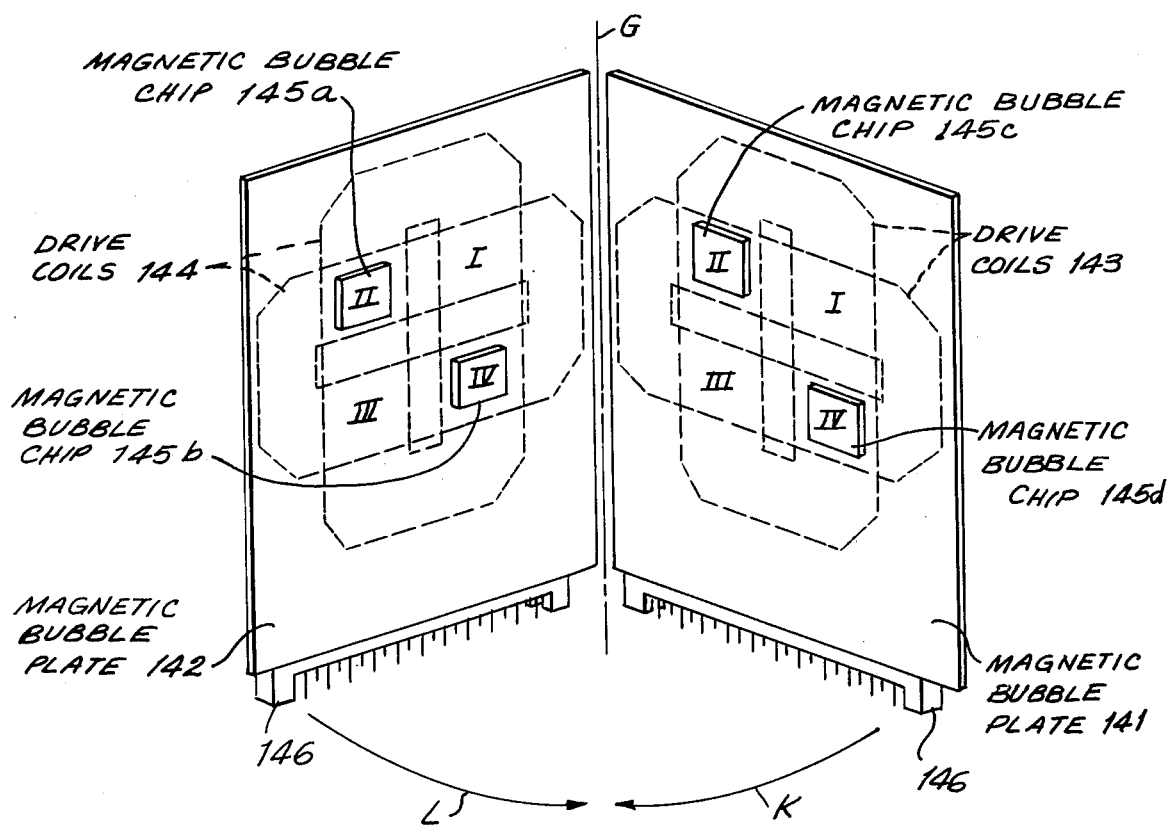

MAGNETIC BUBBLE DEVICE

BACKGROUND OF THE INVENTION

1, Field of the Invention

The present invention relates to a magnetic bubble device.

The magnetic bubble device of the invention utilizes a cylindrical magnetic domain, or magnetic bubble, which is produced by a biasing magnetic field in a magnetic thin film or magnetic bubble chip, having single axis magnetic anisotropy. A magnetic bubble chip is a known component comprising amorphous magnetic thin films, or orthoferrite single crystals, or garnet single crystals formed into thin plate or film configuration.

2. Description of the Prior Art

In the prior art, orthoferrite or garnet single crystals having single axis magnetic anisotropy, are formed in the shape of a thin film, so that an easily magnetizable axis becomes perpendicular to the surface. A magnetic domain of cylindrical configuration, or magnetic bubble, is produced by applying a biasing magnetic field perpendicular to the magnetic bubble chip, perpendicular to the easily magnetizable aixs, of a thin cut magnetic film, or of an amorphous magnetic thin film having single axis magnetic anisotropy and having an easily magnetizable axis perpendicular to the plane of the film. The magnetic bubble may be made to move by providing a magnetic field gradient. This is described in detail in a thesis entitled "Domain Behaviour in Some Transparent Magnetic Oxides" by R. C. Sherwood, J. P. Remeika and H. J. Williams, Journal of Applied Physics, Vol. 30, 1959, pages 215 to 225, and in a thesis entitled "Properties and Device Application of Magnetic Domain in Orthoferrites" by A. H. Bobeck, Bell System Technical Journal, Vol. 46, pages 1901 to 1925.

It is possible to construct different units such as, for example, logical arithmetic units, memory units, and the like by utilizing the characteristics of a magentic bubble and by matching two value data with the present and absent state of a magnetic bubble, and furthermore by combining different functions like magnetic bubble production, transfer, erasure, sorting, etc.

There are several know conventional methods of controlling a magnetic bubble. However, the most widely known method is by installing different types of Permalloy patterns on the surface of a magnetic bubble chip or by applying a rotating magnetic field parallel to such surface of such chip, as described in U.S. Pat. Nos. 3,534,347 and 3,543,252. This method consists of sucking the magnetic bubble in towards the magnetic pole produced at the Permalloy pattern. The Permalloy pattern is, for example, of T-type or I-type, and is formed over the magnetic bubble chip. The sucking operation is accomplished by applying a rotating magnetic field parallel to the magnetic bubble chip surface from outside. The rotating magnetic field is produced by supplying sine wave and cosine wave currents to two orthogonal solenoid coils. The magnetic bubble chip is positioned inside the two solenoid coils. The magnetic field rotates in a circular orbit. The magnetic bubble chip of this conventional type of magnetic bubble unit is placed inside orthogonal solenoid coils or Helmholtz coils, and current is passed through these coils. The current flow produces a magnetic field which is used as a rotating magnetic field.

However, the production of a magnetic field by the use of coils raises the surrounding temperature of the magnetic bubble chip. The rise in temperature consequently largely affects the magnetic characteristics of the magnetic bubble chip and creates the danger of breakdown in the different controls of the magnetic bubble such as, for example, its production, transfer, sorting, etc. This results in the destruction of the magnetic bubble and an increased possibility of loss of data. Suitable temperature design is thus an important problem.

Furthermore, since the magnetic bubble chip is enclosed by solenoid coils, the area for drawing out input and output leads becomes small. If an attempt is made to provide sufficiently large area, the coils become larger than essential, thus requiring a greater area for parts of the coils other than the orthogonal parts. If the size of the device is enlarged, several disadvantages such as, troublesome assembly work, etc., arise for locating the magnetic bubble chip inside the solenoid coil winding.

The principal object of the invention is to provide a magnetic bubble device with good heat radiation characteristics.

An object of the invention is to provide a magnetic bubble device having a sufficient area for drawing out input and output leads from the magnetic bubble chip of said device.

Another object of the invention is to provide a magnetic bubble device having a structure which simplifies its assembly in mass production.

Still another object of the invention is to provide a magnetic bubble device of simple structure, which is readily adaptable to include devices for discharging generated heat.

Yet another object of the invention is to provide a magnetic bubble device in which the magnetic bubble chip is not inside the winding of the drive coil.

Another object of the invention is to provide a magnetic bubble device of simple structure, which is inexpensive in manufacture, and functions efficiently, effecitvely and reliably to control the magnetic bubble produced thereby.

BRIEF SUMMARY OF THE INVENTION

The magnetic bubble device of the invention solves the problems encountered in conventional magnetic bubble devices or units. The most significant feature of the magnetic bubble device of the invention is that instead of the use of solenoid coils as its drive coils, it utilizes a flat faced coil comprising an electrical conductor wound in a flat shape. When current flows through the flat faced coil, the magnetic field parallel to the plane of the coil, from among all the resultant magnetic fields, affects or acts on the magnetic bubble chip, and is consequently utilized as a rotating magnetic field.

The magnetic bubble device or unit of the present invention utilizes a flat drive coil. Since the produced magnetic field parallel to the surface of the coils is utilized, it is only necessary to place the magntic bubble chip at a proper position of the flat surface of said coil. This improves the heat radiation characteristics of the chip, as compared with a conventional magnetic bubble chip placed inside orthogonal solenoid coils. Furthermore, the structure of the magnetic bubble device of the invention makes it easy to adopt other positive measures to discharge the heat generated by the device. The heat discharging measures includes, for example, a heat conduction plate, a heat radiation plate, a heat radiation line, etc. Consequently the heat design of the magnetic bubble device of the invention is simplified. Moreover, since the magnetic bubble chip is positioned parallel to the drive coil, the coil imposes no restrictions on the drawing out of input and output leads from the magentic bubble chip.

In accordance with the invention, a magnetic bubble device has a magnetic bubble chip consisting of magnetic material for producing a magnetic bubble, the magnetic bubble chip having a surface. The magnetic bubble device comprises drive coil means for producing a rotating magnetic field substantailly parallel to the surface of the magnetic bubble chip. The drive coil means includes a flat faced coil consisting of electrically conductive material having flat windings. The flat faced coil produces a magentic field substantially in its own plane. The magnetic bubble chip is positioned in the magnetic field produced by the flat faced coil.

In one embodiment, the drive coil means comprises a pair of flat faced coils in substantially parallel planes and crossing each other. The magnetic bubble chip is positioned where the flat faced coils cross each other. The flat faced coils cross each other at substantially right angles.

A conductive plate of electrically conductive material is provided substantially parallel to the flat faced coils and in facing relation therewith. The magnetic bubble chip is positioned between the flat faced coils and the conductive plate.

In another embodiment, the flat faced coil is bent over on itself and has two spaced substantially parallel parts joined at a corresponding end of each. The magnetic bubble is positioned between the parts of the flat faced coil.

In still another embodiment, the drive coil means comprises a plurality of flat faced coils in substantially parallel planes and crossing each other. The magnetic bubble chip is positioned where a pair of next-adjacent flat faced coils cross each other. The flat faced coils cross each other at substantially right angles. Alternate ones of the flat faced coils extend in one direction and the remaining flat faced coils extend in a direction at right angles to the one direction.

In a modification, a first pair of the plurality of flat faced coils cross each other in facing relation. A second pair of the plurality of flat faced coils cross each other in facing relation. The magnetic bubble chip is positioned between the first and second pairs of coils.

In accordance with the invention, a magnetic bubble device has a plurality of magnetic bubble chips each consisting of magnetic material for producing a magnetic bubble under the effect of a bias magnetic field. Each of the magnetic bubble chips has a surface. The magnetic bubble device comprises a plurality of drive coils for producing a rotating mgnetic field substantially parallel to the surfaces of the magnetic bubble chips. The plurality of drive coils includes a flat faced coil consisting of electrically conductive material having flat windings. The flat faced coil produces a magnetic field substantially in its own plane. Each of the magentic bubble chips is positioned in a corresponding one of a plurality of areas where each direction of rotation of the magnetic field produced by the drive coils and acting on the magnetic bubble chip is different. Selected ones of the magnetic bubble chips are positioned in areas where the rotating magnetic field acts clockwise. Selected others of the magnetic bubble chips are positioned in areas where the rotating magnetic field acts counterclockwise. The ones of the magnetic bubble chips and the others of the magnetic bubble chips are in juxtaposition whereby the magnetic bubble produced by each of the magnetic bubble chips is shiftable in a positive direction.

BRIEF DESCRIPTION OF THE DRAWINGS

In order that the invention may be readily carried into effect, it will now be described with reference to the accompanying drawings, wherein

FIGS. 13A, 13B and 13C are schematic diagrams illustrating the method of the present invention for shifting a magnetic bubble; and FIG. 14 is a perspective view of still another embodiment of the magnetic bubble device of the invention.

DETAILED DESCRIPTION OF THE INVENTION

Figure 1A:
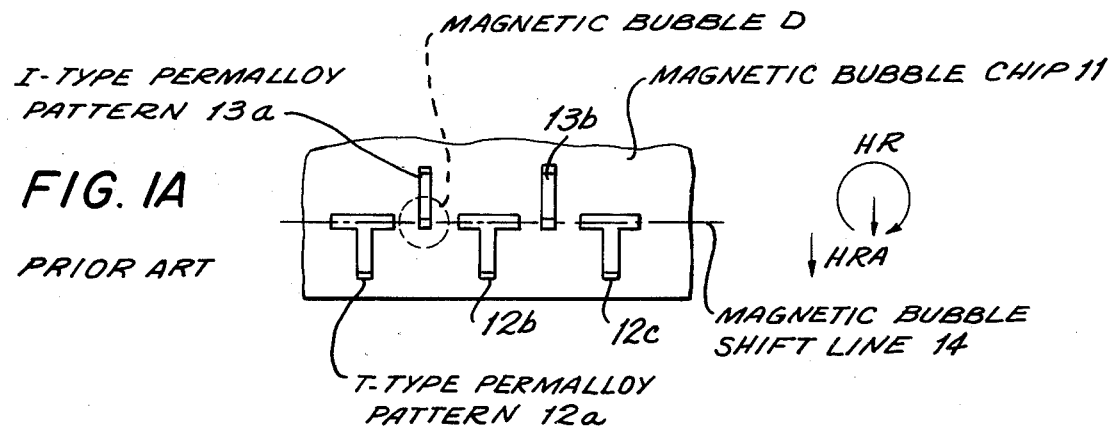
FIGS. 1A, 1B, 1C and 1D are schematic diagrams illustrating a common method of the prior art for shifting a magnetic bubble.

FIGS. 1A, 1B, 1C and 1D illustrate a common known method of controlling the shifting of a magnetic bubble. A magnetic bubble chip 11 of FIG. 1A usually consists of single crystals of orthoferrite, garnet, etc., having single axis magnetic anisotropy. The magnetic bubble chip 11 is either built up or cut in the shape of a thin plate or film on a silicon substrate, in a manner whereby its easily magnetizable axis is perpendicular to the surface of the substrate. When a biasing magnetic field perpendicular to the plane of the magnetic bubble chip 11 is applied, a magnetic bubble D is produced.

T-type Permally patterns 12a, 12b, 12c, and so on, and I-type Permalloy patterns 13a, 13b, and so on, are formed along a magnetic bubble shift line 14 on the surface of the magnetic bubble chip 11 by any suitable known method such as, for example, electrode positing and etching. When a rotating magnetic field HR parallel to the plane of the magnetic bubble chip 11 is applied, the magnetic bubble D is pulled toward the negative magnetic pole produced at the Permalloy pattern 12a, 12b, 12c, 13a, 13b. Thus, for example, as shown in FIG. 1A, where there is a rotating magnetic field HRA, the magnetic pole formed by magnetization of the Permalloy pattern 13a attracts the magnetic bubble.

Figure 1B:
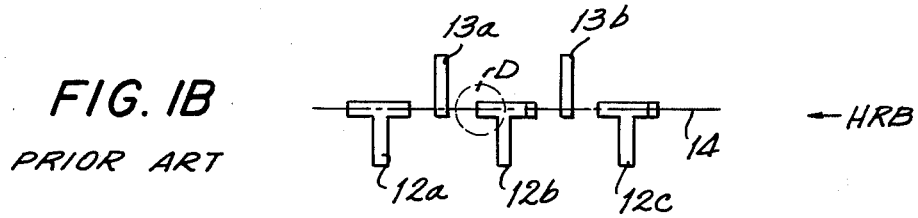

When the magnetic bubble D is at the position shown in FIG. 1A, and when the rotating magnetic field rotates in a clockwise direction and is in a direction HRB, a magnetic pole is formed at the Permalloy pattern 12b, as shown in FIG. 1B, and attracts the magnetic bubble D.

Figure 1C:
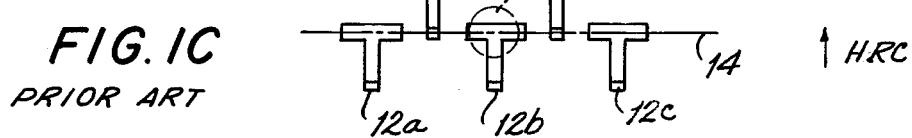
Figure 1D:
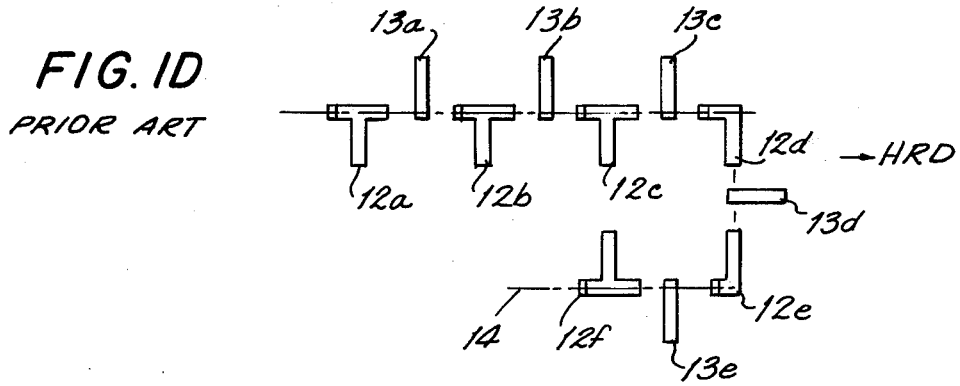

Similarly, when the rotating magnetic field is in the directions HRC and HRD, the magnetic bubble D shifts toward the right, as shown in FIGS. 1C and 1D.

Figure 2A:
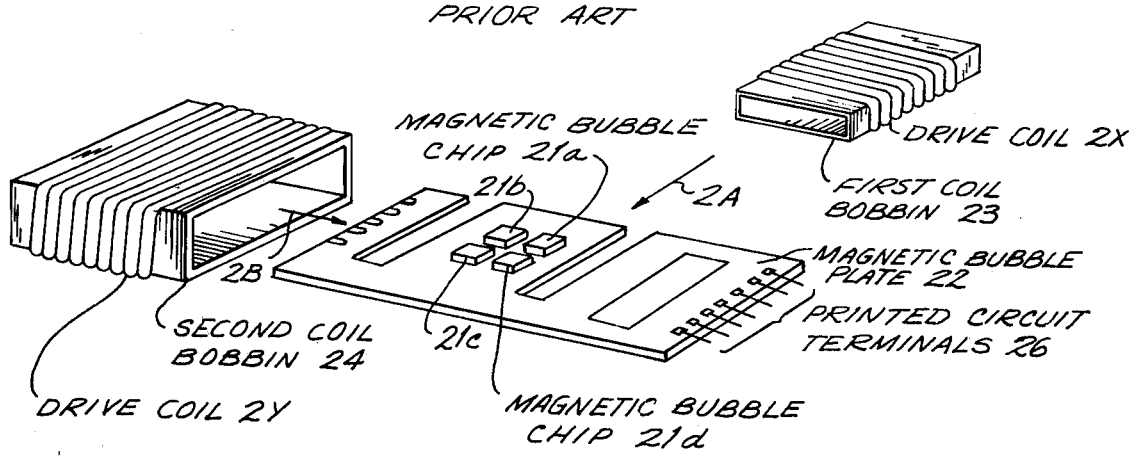
FIG. 2A is an exploded perspective view of an embodiment of a conventional magnetic bubble device.
Figure 2B:
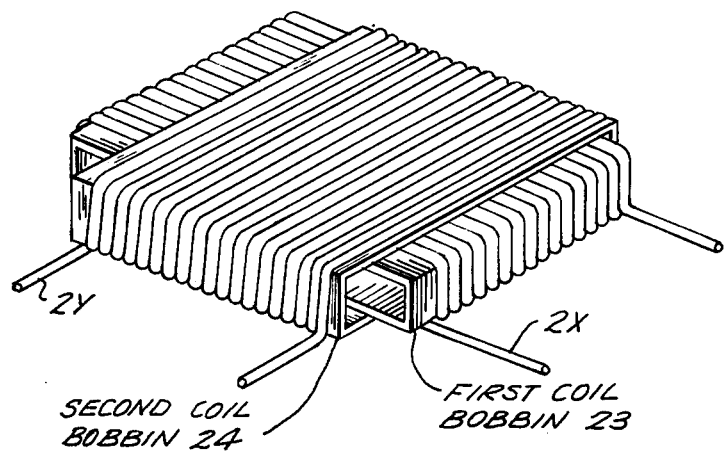
FIG. 2B is a perspective view of the embodiment of FIG. 2A in assembled condition.

FIGS. 2A and 2B illustrate a conventional magnetic bubble device or unit utilizing a magnetic bubble chip of the type described with regard to FIG. 1A. In FIG. 2A, magentic bubble chips 21a, 21b, 21c, and 21d are provided on a magnetic bubble plate 22. Printed circuit boards, input and output leads and control leads for the magnetic bubble chips 21a, 21b, 21c and 21d are provided on the back surface of the magnetic bubble plate 22, which is not shown in FIGS. 2A and 2B. The printed circuits and leads are connected to input and output teminals and a control terminal 26. A drive coil 2X is wound on a first coil bobbin 23 and a second drive coil 2Y is wound on a second coil bobbin 24. The drive coils 2X and 2Y are for the magnetic bubble plates in the X and Y directions.

The drive coil 2X is inserted as indicated by an arrow 2A in FIG. 2A, so that the magnetic bubble chips 21a, 21b, 21c and 21d are inside said drive coil. Similarly, the drive coil 2Y is inserted as indicated by an arrow 2B in FIG. 2A. As a result, the magnetic bubble chips 21a, 21b, 21c and 21d are positioned inside the space between the orthogonal drive coils 2X and 2Y, as shown in FIG. 2B. The magnetic bubble plate 22 is not shown in FIG. 2B in order to maintain the clarity of illustration.

Figure 3A:
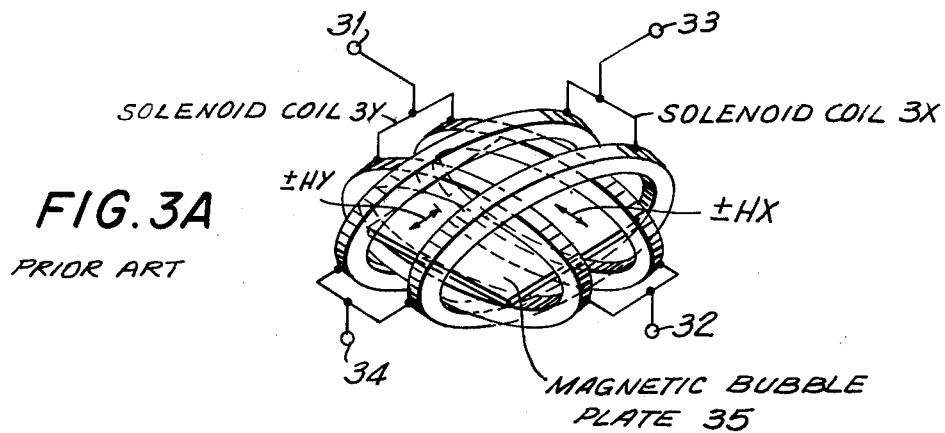
FIG. 3A is a perspective view of the rotating magnetic field produced by the magnetic bubble device of FIGS. 2A and 2B.
Figure 3B:
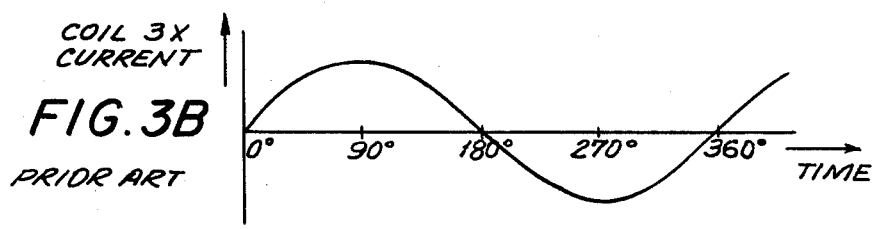
FIGS. 3B and 3C are graphical presentations of currents supplied to the drive coils of the magnetic bubble device of FIGS. 2A and 2B.
Figure 3C:
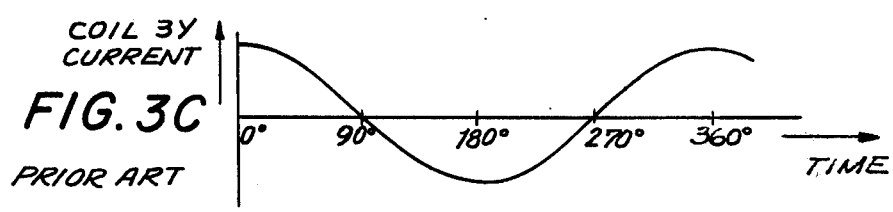
Figure 3D:
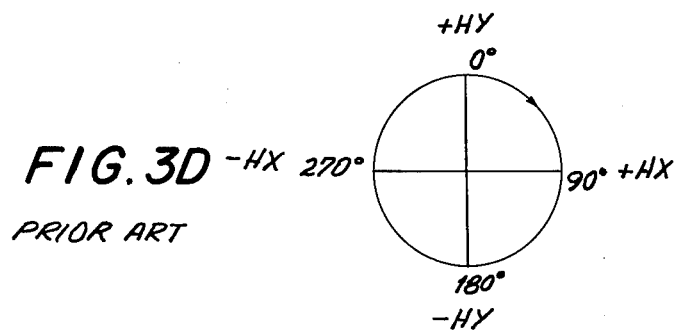
FIG. 3D illustrates the magnetic field of the magnetic bubble device of FIGS. 2A and 2B.

FIG. 3A illustrates the rotating magnetic field produced by the drive coils 2X and 2Y of FIGS. 2A and 2B. The magnetic field is parallel to the surface of the magnetic bubble chips 2a, 2b, 2c and 2d. FIG. 3A shows the relation between solenoid coils 3X and 3Y and a magnetic bubble plate 35 supporting magnetic bubble chips (not shown in FIG. 3A). A composite magnetic field consisting of a magnetic field ± HX produced by the coil 3X and a magnetic field ± HY produced by the coil 3Y is made to operate at the magnetic bubble plate 35 by a supply of a sine wave current, as shown in FIG. 3B, between the terminals 33 and 34 of the coil 3X, and a supply of a cosine wave current, as shown in FIG. 3C, between the terminals 31 and 32 of the coil 3Y. The driving magnetic field locus at the magnetic bubble plate 35 becomes circular, as shown in FIG. 3D, and is the resultant rotating magentic field, rotating in the direction of the arrow of FIG. 3D.

As shown in FIGS. 1A, 1B, 1C, 1D, 2A, 2B and 3A, the known conventional magnetic bubble unit consists of magnetic bubble chips placed inside the space between two orthogonal solenoid coils, indicated in FIGS. 2A and 2B as the coils 2X and 2Y. In the known unit, when current flows through the drive coils 2X and 2Y in order to produce the rotating magnetic field, it produces heat. Since the magnetic bubble chips are located in the space between the orthogonal drive coils, their heat radiating characteristics are poor. This results in increased atmospheric temperature around the magnetic bubble chips. This temperature variation adversely affects the magnetic characteristics of the magnetic bubble chips and enhances the possibility of affecting the normal function of magnetic bubble production, transfer, sorting, etc. It may even destroy the magnetic bubble and thereby cause loss of data. This makes it very difficult to prepare a heat design of the magnetic bubble unit. Furthermore, in the known magnetic bubble unit, since the input and output leads and the control leads of the magnetic bubble chips are drawn through outside the space between the orthogonal drive coils 2X and 2Y, the number of such is severely restricted. Moreover, if an area is to be provided which is sufficient to draw out the leads, the size of drive coils becomes inconsistently large, thereby increasing the size of the unit to dimensions which are too large. Furthermore, in the known magnetic bubble unit, the positioning of the magnetic bubble chips inside the orthogonal solenoid coils results in extremely difficult and troublesome assembly work, during manufacture.

Figure 4A:
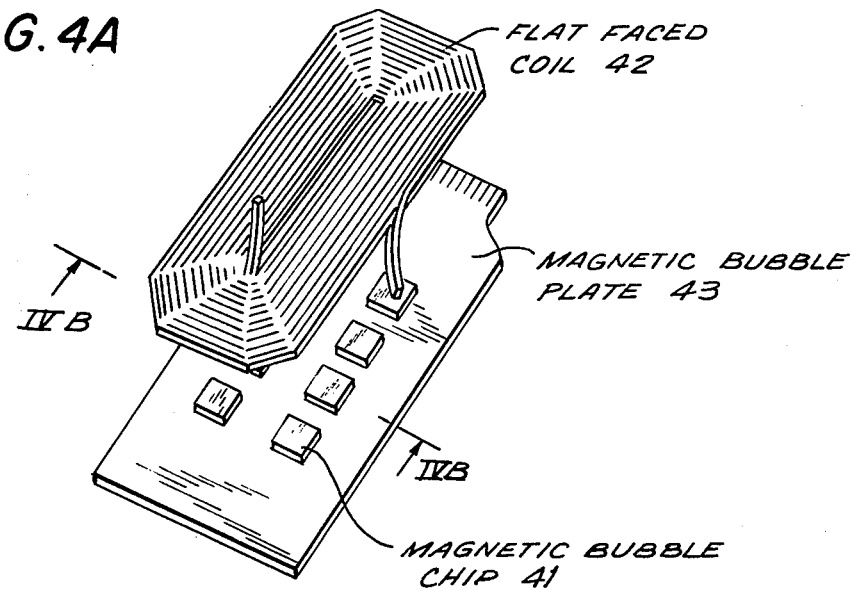
FIG. 4A is a perspective view of an embodiment of the magnetic bubble device of the invention.
Figure 4B:
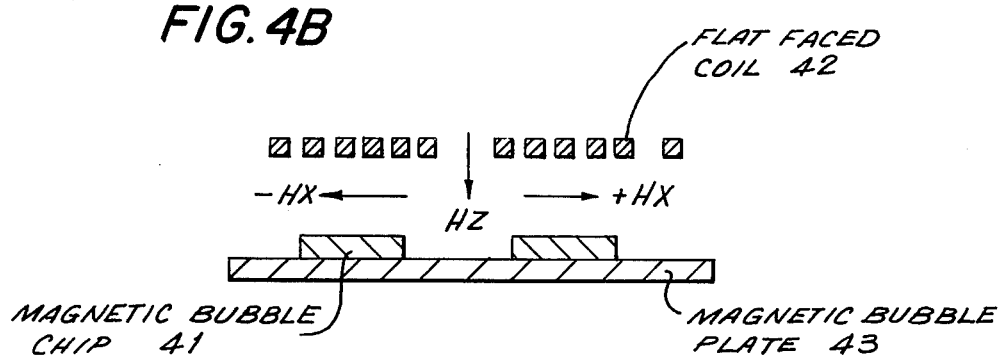
FIG. 4B is a cross-sectional view, on an enlarged scale, taken along the lines IVB—IVB, of FIG. 4A.

FIGS. 4A and 4B illustrate an embodiment of the magnetic bubble device of the invention. The major difference between the magnetic bubble device of the invention, as shown in FIGS. 4A and 4B, is the drive coil of applicant's device. The drive coil of applicant's device differs from the conventional solenoid coil, since it is a flat coil consisting of an electrical conductor 42 wound in a flat form. When current flows through the electrical conductor of the flat faced coil 42, a magnetic field HZ perpendicular to the surface or plane of the coil is produced. The magnetic field HZ extends through a space inside the flat faced coil 42, as shown in FIG. 4B. The current through the coil 42 also produces magnetic fields +HX, −HX parallel to the plane of the coil around the plane of said coil.

A parallel magnetic field may thus be operated or effective on the magnetic bubble chip 41 by providing the magnetic bubble plate 43 having parallel magnetic bubble chips 41, and so on, thereon, in a plane parallel to the plane of the flat faced coil 42, as shown in FIGS. 4A and 4B. Input and output leads and control leads of the magnetic bubble chip 41 are provided via printed circuitry, in a well known manner, on the surface of the magnetic bubble plate 43 opposite that on which the magnetic bubble chip 41 is provided.

The flat faced coil 42 may be produced by printed wiring on printed circuit boards, or by winding an insulation covered electrical conductor into a coil and then hardening the coil with resin. The coil 42 may even comprise a single turn winding if it produces the desired magnetic strength. Furthermore, the flat faced coil 42 may have two and three layer connections, as shown in FIG. 4A.

Figure 5A:
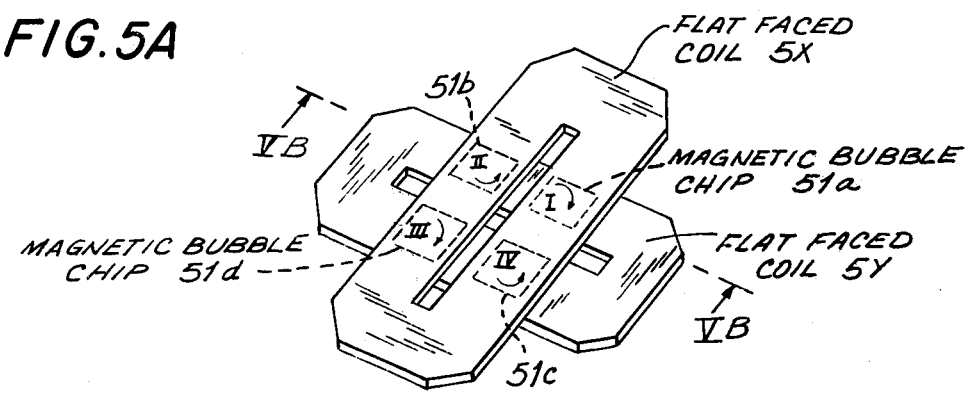
FIG. 5A is a perspective view of another embodiment of the magnetic bubble device of the invention.
Figure 5B:
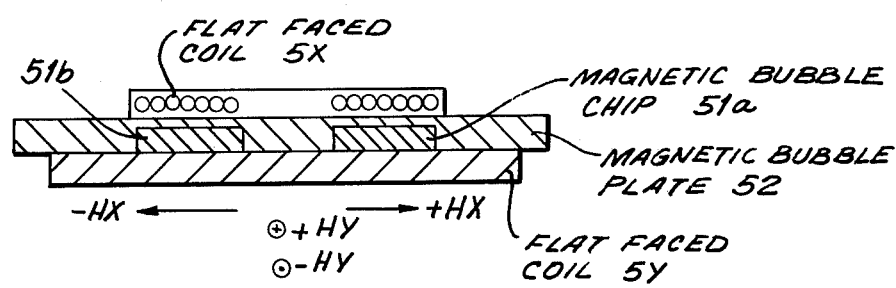
FIG. 5B is a cross-sectional view, on an enlarged scale, taken along the lines VB—VB, of FIG. 5A.

FIGS. 5A, 5B, 5C and 5D show a magnetic bubble device of the invention and illustrate the operating of a rotating magnetic field at a magnetic bubble chip by use of flat faced coils. In the embodiment of FIGS. 5A and 5B, magnetic bubble chips 51a, 51b, 51c and 51d are positioned at the crossing points I, II, III, and IV of the orthogonal flat faced coils 5X and 5Y. When sine wave and cosine wave currents flow through the flat faced coils 5X and 5Y, respectively, rotating magnetic fields +HX, +HY, −HX and −HY parallel to the planes of the coils may be obtained at the magnetic bubble chips 51a, 51b, 51c and 51d.

If it is supposed that clockwise magnetic fields are produced at the crossing points I and III, the magnetic fields at the crossing points II and IV are counterclockwise magnetic fields. This is meant to operate the magnetic field produced for current in any one direction in reverse direction to +HX and −HX by adjusting the flat faced coil 5X, for example.

The magnetic bubble plate 52 is not shown in FIG. 5A in order to maintain the clarity of illustration.

Figure 5C:
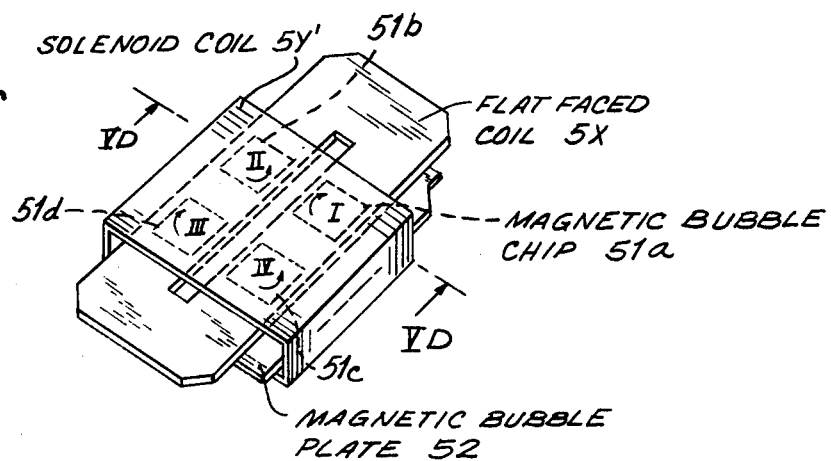
FIG. 5C is a perspective view of a modification of the embodiment of FIG. 5A.
Figure 5D:
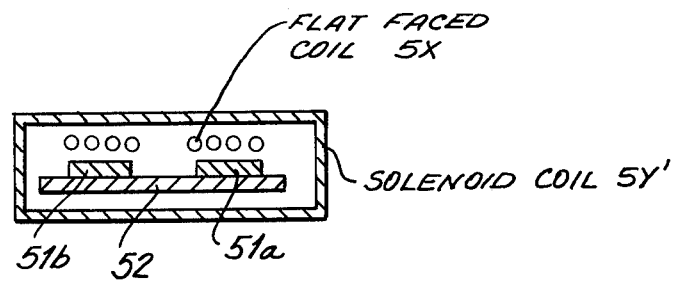
FIG. 5D is a cross-sectional view, on an enlarged scale, taken along the lines VD—VD, of FIG. 5C.

In the modification of FIGS. 5C and 5D, the flat faced coil 5X is assembled in a unit with a solenoid coil 5Y'. In FIGS. 5C and 5D, the magnetic bubble plate 52 is positioned with the magnetic bubble chips 51a, 51b, 51c and 51d placed at the cross points I, II, III and IV of the flat faced coil 5X and the solenoid coil 5Y'. Similarly to the embodiment of FIGS. 5A and 5B, when sine wave and cosine wave currents flow through the flat faced coil 5X and the solenoid coil 5Y', respectively, a clockwise rotating magnetic field is produced at the cross points I and III, and a counterclockwise rotating magnetic field is produced at the cross points II and IV.

The magnetic bubble device of FIGS. 5A to 5D permits a flat faced coil consisting of an electrical conductor wound into a flat shape to be used as a drive coil. When magnetic bubble chips are placed at the operating points of the magnetic field surrounding the plane of the flat faced coil, the heat radiating characteristics of said magnetic bubble chips are improved. Furthermore, the mounting of radiation plates is facilitated in the magnetic bubble device of the invention. It is also possible to draw input and output leads from the magnetic chips through any desired points in the area. In the embodiment of FIG. 5A, the leads may be drawn in any direction around the magnetic bubble chips, while in the modification of FIG. 5C the leads may be drawn in either of two directions.

Figure 6A:
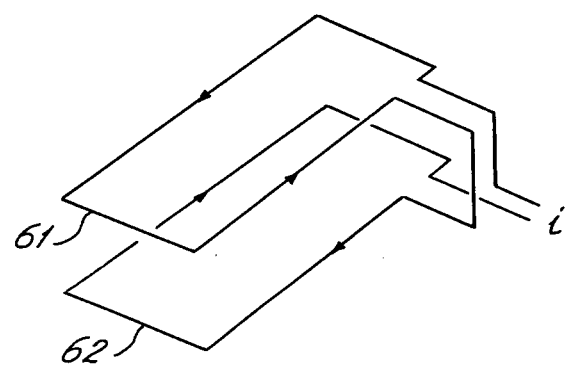
FIGS. 6A, 6B and 6C illustrate another arrangement of the flat faced coil of the magnetic bubble device of the invention.
Figure 6B:
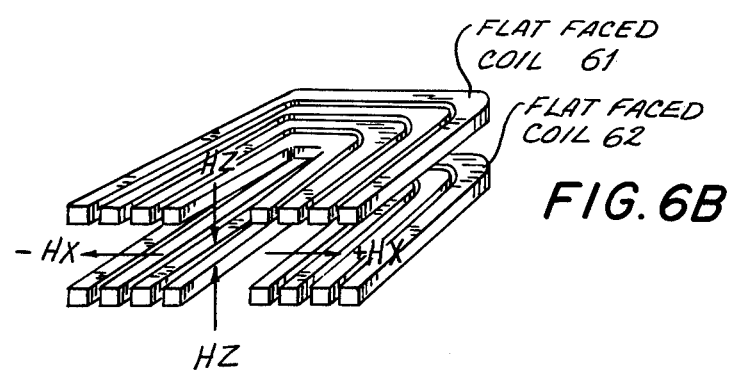
Figure 6C:
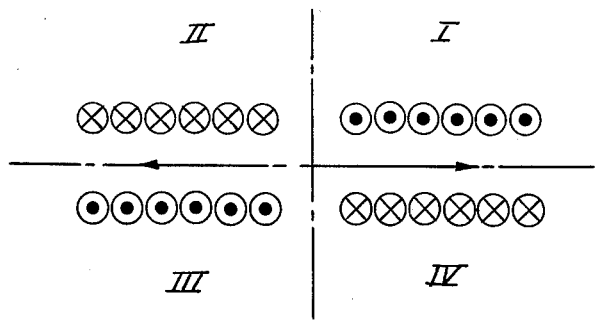

FIGS. 6A, 6B and 6C illustrate another arrangement of the flat faced coil of the invention. FIG. 6A illustrates the circuit of a pair of flat faced coils. FIG. 6B illustrates the positioning of a pair of plat faced coils. FIG. 6C shows the directions of current flow in the flat faced coils of FIGS. 6A and 6B. In FIGS. 6A, 6B and 6C, each of a pair of flat faced coils 61 and 62 is similar to the flat faced coil 42 of FIGS. 4A and 4B. The flat faced coils 61 and 62 are positioned in spaced parallel relation with each other, as shown in FIG. 6B, and are electrically connected to each other, as shown in FIG. 6A, so that current flows in opposite directions in each coil, as shown in FIG. 6A. The flow of the current $i$ is shown by arrows in FIG. 6A. The magnetic field produced by the coils of FIG. 6B is perpendicular to the magnetic bubble chip (not shown in the FIGS.). The magnetic field has components HZ vertical to the planes of the flat faced coils 61 and 63. The components HZ compensate for each other. The magnetic field component HX is parallel to the planes of the flat faced coils and may be obtained only when the device is in a stable state. The inductance component of the HZ axis is therefore decreased considerably. As a result, a drive coil having a high efficiency magnetic field may be provided. At the same time, the bias magnetic field of the magnetic bubble chip, which is the field perpendicular to the plane of the magnetic bubble chip, is not affected.

Basically, a magnetic field is supplied by a solenoid coil. FIG. 6C is a cross-sectional view of the solenoid coil. Thus, for example, in case the difference of the magnetic field phase in two areas, I, IV and II, III, is 180°, one conventional solenoid coil is positioned at I, IV in FIG. 6C, and the other conventional solenoid coil is positioned at II, III in FIG. 6C, and the current flows in the two coils in opposite directions. However, as a result of investigation of the direction of current flow in the coil, it has been found that the direction of current flow is exactly the same as in the case where one flat faced coil is positioned at I, II in FIG. 6C, and the other flat faced coil is positioned at III, IV in FIG. 6C in parallel up and down, and the current flows in opposite directions in the two coils. It is thus comprehensible that the function of flat faced coils positioned in parallel with a current flow in opposite directions is exactly the same as the conventional function of a solenoid coil.

Figure 7A:
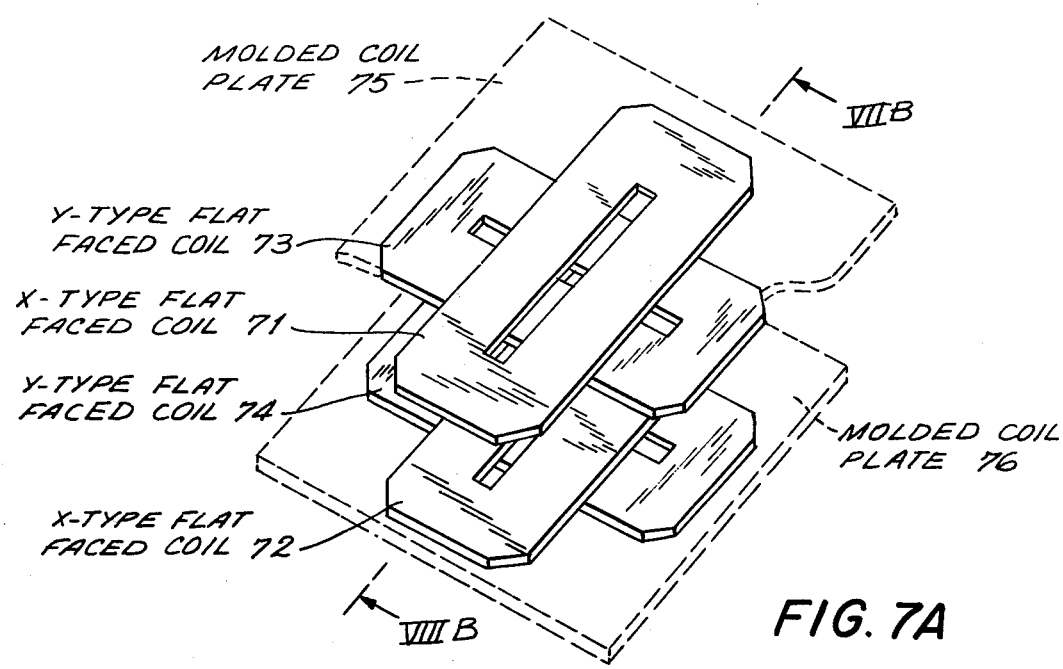
FIG. 7A is a persepctive view of still another embodiment of the magentic bubble device of the invention.

FIG. 7A is a perspective view of an embodiment of the magnetic bubble device of the invention utilizing the principle of FIGS. 6A, 6B and 6C. The magnetic bubble device of FIG. 7A has X-type flat faced coils 71 and 72 and Y-type flat faced coils 73 and 74. The flat faced coils 71 and 73 are provided on a molded coil plate 75. The two X-type coils 71 and 72 and the two Y-type coils 73 and 74 are positioned in parallel relation, up and down alternately.

If the X-type coils 71 and 72 and the Y-type coils 73 and 74 are connected as shown in FIG. 6A, and if sine wave and cosine wave currents are supplied, a rotating magnetic field is produced, as described with reference to FIGS. 5A to 5D.

Figure 7B:
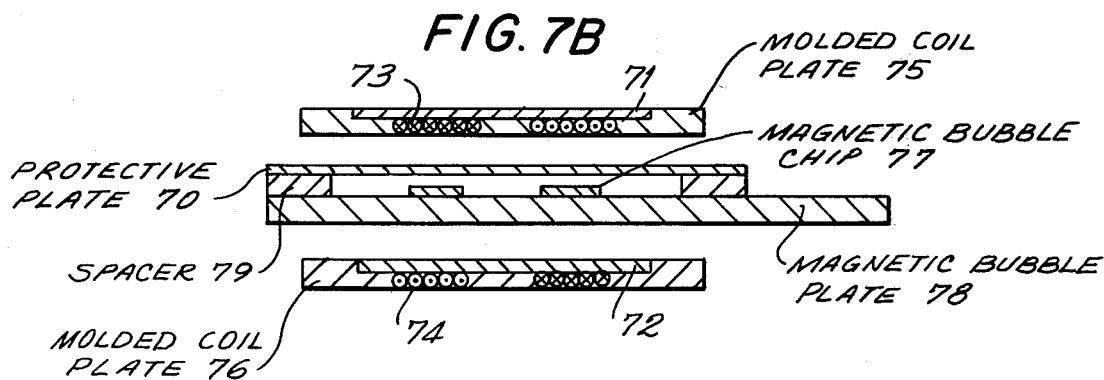
FIG. 7B is cross-sectional view, on an enlarged scale, taken along the lines VIIB—VIIB, of FIG. 7A.

As shown in FIG. 7B, a magnetic bubble plate 78 on which magnetic bubble chips 77, and so on, are mounted, is positioned between the coil plates 75 and 76. A protective plate 70 and a spacer 79 are provided.

The magnetic bubble plate 78 is omitted from FIG. 7A in order to maintain the clarity of illustration.

Figure 7C:
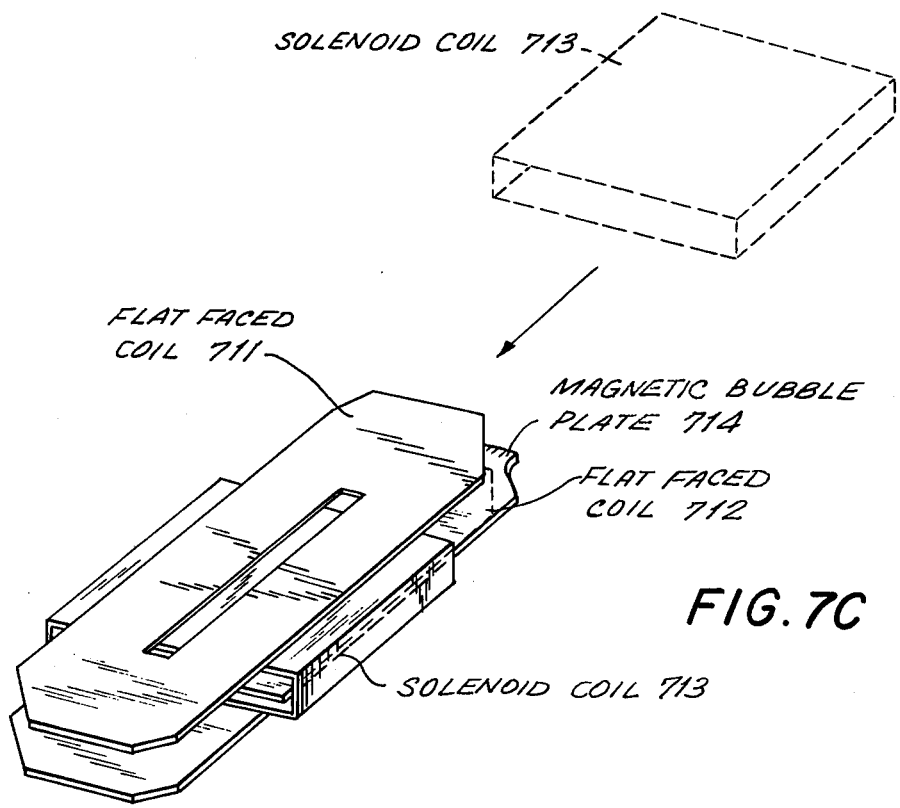
FIG. 7C is a perspective view of yet another embodiment of the magnetic bubble device of the invention.
Figure 7D:
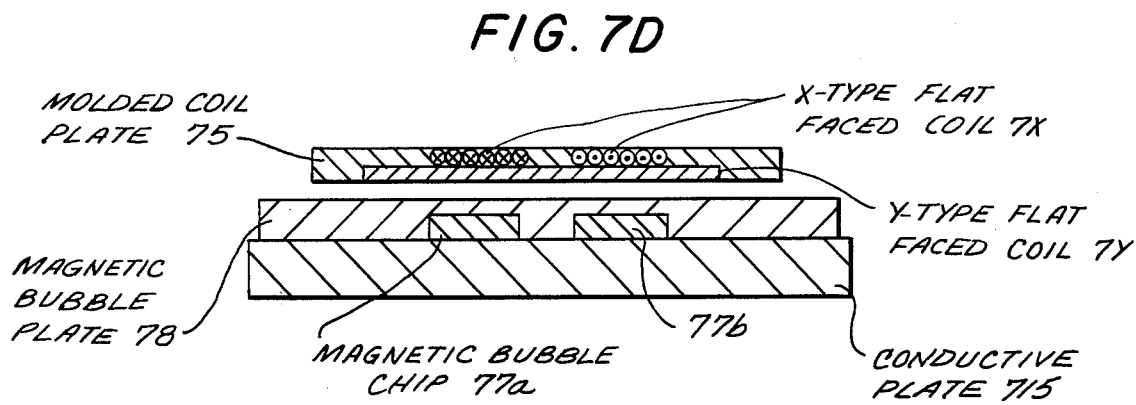
FIG. 7D is a cross-sectional view of another embodiment of the magentic bubble device of the invention.

FIGS. 7C and 7D are views of different embodiments of the magnet bubble device of the invention utilizing the principle of FIGS. 6A, 6B and 6C. In the embodiment of FIG. 7C, two flat faced coils 711 and 712 of the type shown in FIG. 6B are utilized as the X-type coil. A solenoid coil 713 is used as the Y-type coil. The coils are combined. The solenoid coil 713 is positioned between the flat faced coils 711 and 712. The magnetic bubble plate 714, on which the magnetic bubble chips are mounted, is positioned in the solenoid coil 713.

The embodiment of FIG. 7D includes an X-type coil 7X and a Y-type coil 7Y. A molded drive coil plate 75 includes the coils 7X and 7Y positioned in crossing relation to each other. Magnetic bubble chips 77a and 77b are mounted on a magnetic bubble plate 78. The device of FIG. 7d is mounted on a conductive plate 715.

The drive coil plate 75 is provided on either surface, upper or lower, of the magnetic bubble plate 78. In FIG. 7D, 715 is provided on one surface of the magnetic bubble plate 78, instead of the drive coil plate 75. In the embodiment of FIG. 7D, eddy currents and image currents flow in the conductive plate 715, due to the current flowing in the drive coils 7X and 7Y provided on the other surface of the magnetic bubble plate 78. As a result, the conductive plate 715 may function as a drive coil. At the same time, the conductive plate 715 may shield the device from outside magnetism. The conductive plate 715 is also effective as a radiator plate. The conductive plate 715 is preferably an aluminum plate, considering the points of mechanical strength, heat radiation efficiency, lightness of weight, heat conductivity, etc. However, iron or brass may also be used for the conductive plate.

Results of experimentation by the inventors confirm that the magnetic efficiency of the device if FIG. 7D does not deteriorate compared with the devices of FIGS. 7A, 7B and 7C, in which the drive coils are provided on both surfaces of the magnetic bubble plate.

Figure 8A:
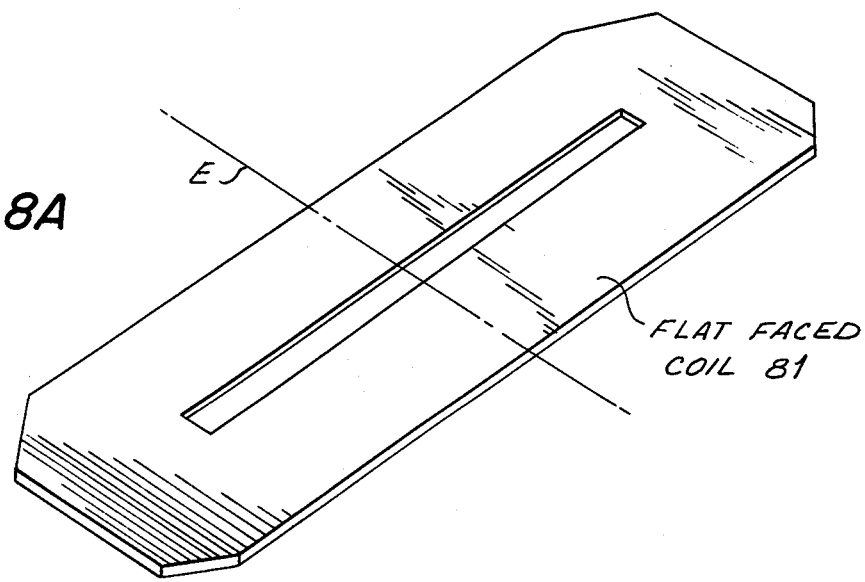
FIG. 8A is a perspective view of an embodiment of the flat faced coil of the magentic bubble device of the invention.
Figure 8B:
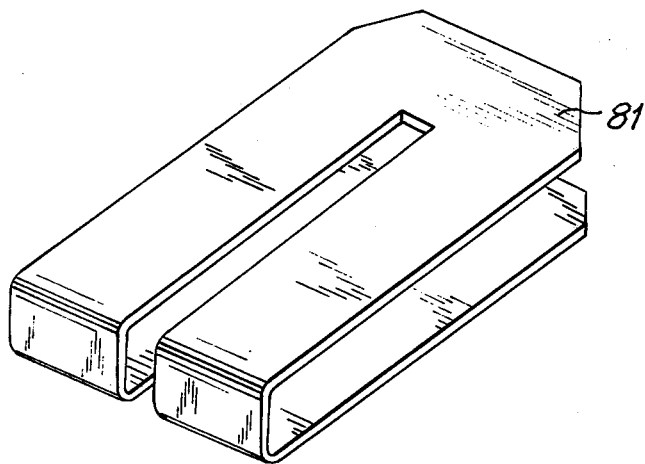
FIG. 8B is a perspective view of another embodiment of the flat faced coil of FIG. 8A.
Figure 8C:
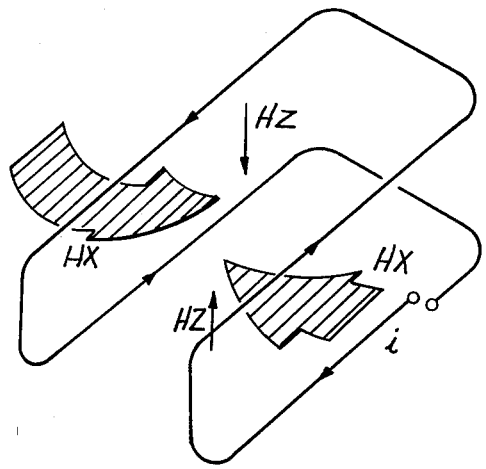
FIG. 8C is a circuit diagram of the flat faced coil of FIG. 8A.

FIGS. 8A, 8B and 8C illustrate a coil for use in a device utilizing the principle of FIGS. 6A, 6B and 6C. The flat faced coil 81 of FIG. 8A is bent at the middle line E thereof to produce the coil shown in FIG. 8B. When a current $i$ flows in the coil 81 of FIG. 8B, as shown in FIG. 8C, the magnetic field components HZ perpendicular to the plane of the coil compensate for each other and only the magnetic field components HX parallel to the plane of the coil may be actuated. A combination of two coils shown in FIG. 8B provides a drive coil having the same function as that of the coils shown in FIGS. 7A to 7D.

Figure 9:
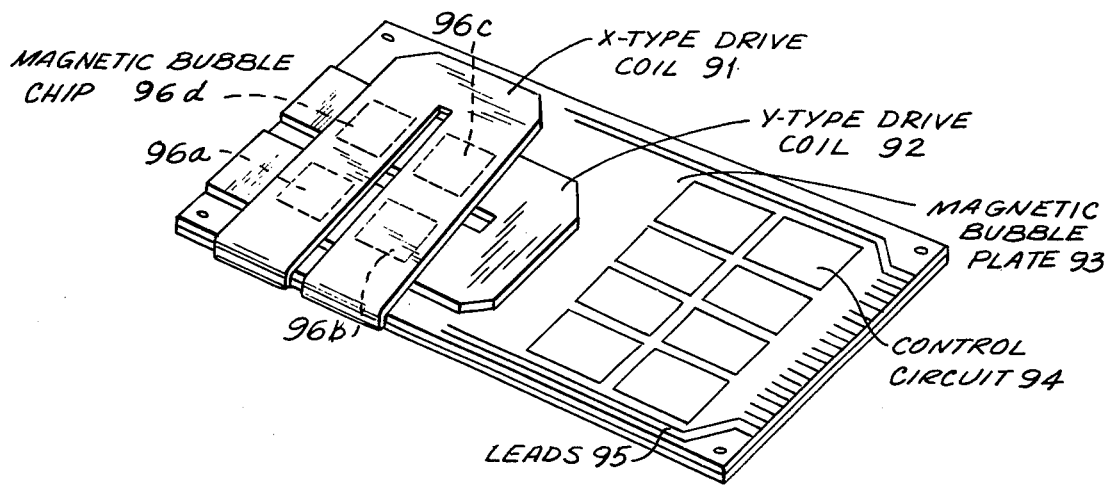
FIG. 9 is a perspective view of an embodiment of the magnetic bubble device of the invention utilizing drive coils similar to that of FIG. 8B.
Figure 10:
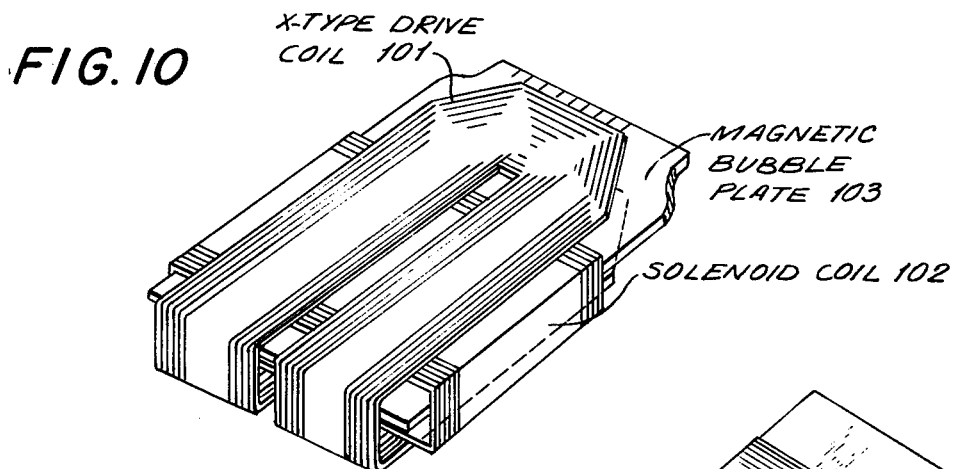
FIG. 10 is a perspective view of another embodiment of the magnetic bubble device of the invention utilizing drive coils similar to that of FIG. 8B.
Figure 11:
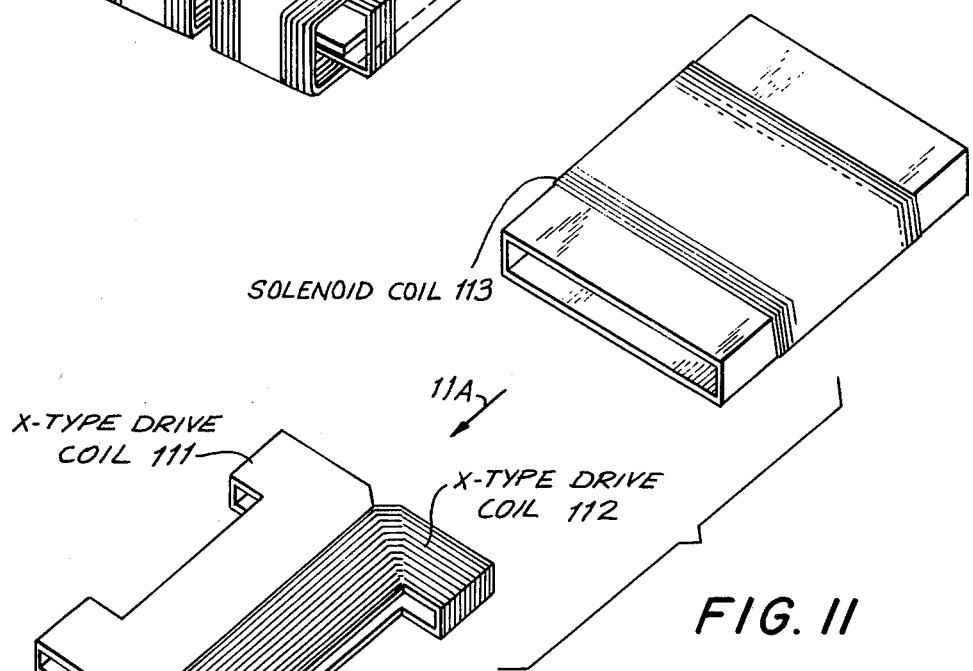
FIG. 11 is a perspective view of still another embodiment of the magnetic bubble device of the invention utilizing drive coils similar to that of FIG. 8B.

FIGS. 9, 10 and 11 show different embodiments of magnetic bubble devices of the invention, utilizing drive coils similar to that of FIG. 8B.

The magnetic bubble device of FIG. 9 has an X-type drive coil 91, a Y-type drive coil 92 and a magnetic bubble plate 93. A plurality of magnetic bubble chips 96a, 96b, 96c and 96d are mounted on the magnetic bubble plate 93. An electric control circuit 94 controls the inputs and outputs of the device and the device itself. Input and output leads and control leads 95 are provided. The leads extend to the magnetic bubble chips and are preferably provided by printed wiring.

In the embodiments of FIGS. 10 and 11, the bent flat faced coil of FIG. 8B is combined with a solenoid coil. In the embodiment of FIG. 10, a bent flat faced coil 101 functions as an X-type drive coil and a solenoid coil 102 functions as a Y-type drive coil. The solenoid coil 102 is positioned between the planar parts of the bent flat faced coil 101. A magnetic bubble plate 103 is positioned in the solenoid coil 102.

Similarly to the embodiment of FIG. 10, in the embodiment of FIG. 11, two bent flat faced coils 111 and 112 function as the X-type coil and a solenoid coil 113 functions as the Y-type coil. The coils 111, 112 and 113 are combined, with the X-type coils 111 and 112 being covered by the Y-type coil 113, as indicated by an arrow 11A. A magnetic bubble plate, which is the same as that of FIG. 7B, and is not shown in FIG. 11, in order to maintain the clarity of illustration, is positioned in the coils 111, 112 and 113. The magnetic bubble chips are mounted on the magnetic bubble plate.

Figure 12:
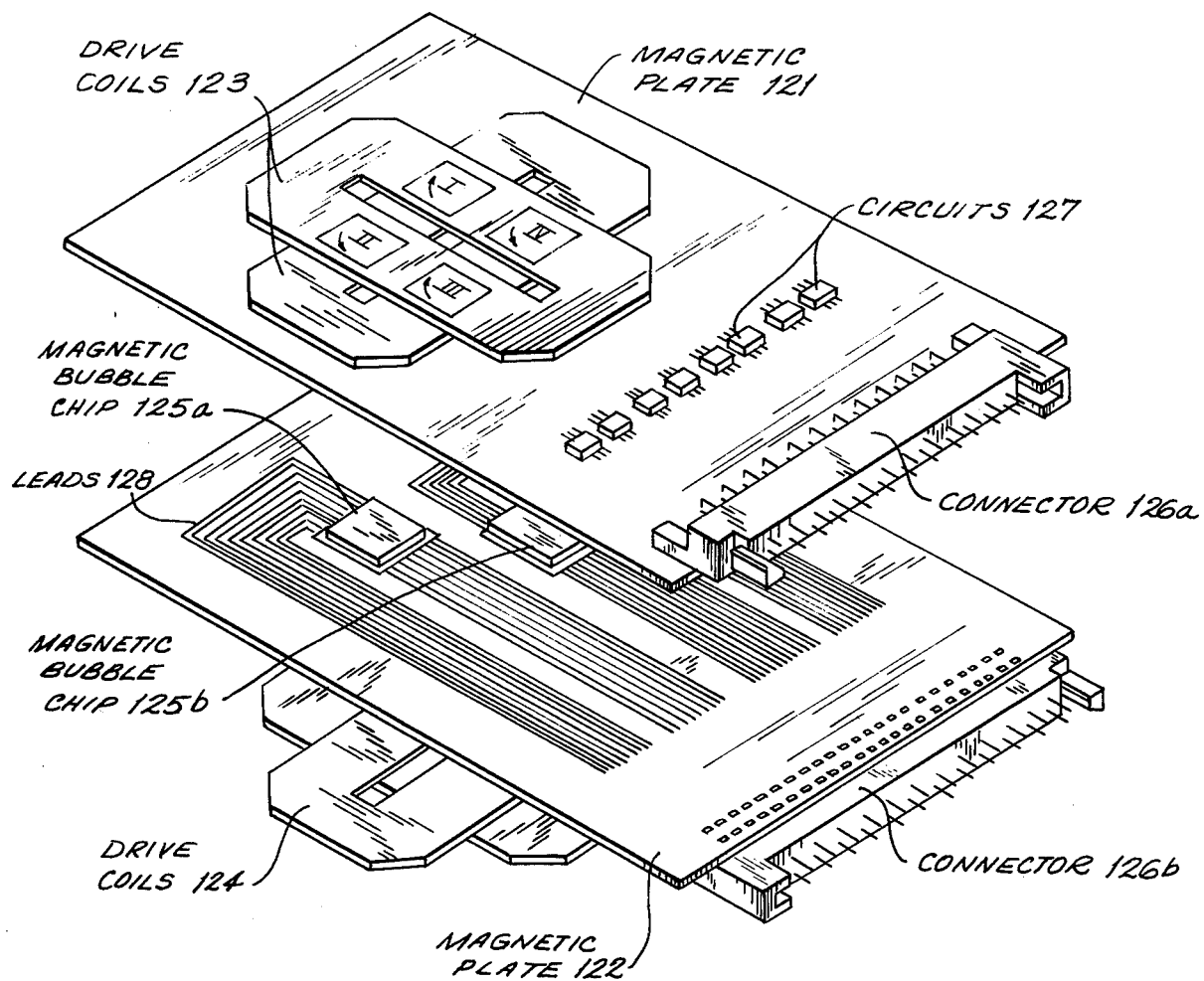
FIG. 12 is an exploded perspective view of another embodiment of the magnetic bubble device of the invention.

FIG. 12 shows another embodiment of the magnetic bubble device of the invention. In FIG. 12, magnetic plates 121 and 122 comprise printed circuit substrates. A flat faced coil 123, which is a combination of an X-type coil and a Y-type coil, is positioned on the surface of the magnetic plate 121 farthest from the magnetic plate 122. A flat faced coil 124, which is a combination of an X-type coil and a Y-type coil, is positioned on the surface of the magnetic plate 122 farthest from the magnetic plate 121. Accumulated circuits 127, including input and output circuitry and control circuitry for the magnetic bubble device, and a connector 126a mounted for input and output terminals, are provided on the surface of the magnetic plate 121 farthest from the magnetic plate 122. Similar accumulated circuits (not shown in FIG. 12) and a conductor 126b mounted for input and output terminals, are provided on the surface of the magnetic plate 122 farthest from the magnetic plate 121.

Magnetic bubble chips 125a and 126b are mounted on the surface of the magnetic plate 122 facing the magnetic plate 121. Input and output and control leads connecting the accumulated circuits 127 and the magnetic bubble chips 125a and 125b are formed by printed wiring on the surface of the magnetic plate 122 facing the magnetic plate 121. The magnetic bubble chips 125a and 125b are positioned in the crossing area of the drive coils 123 and 124, indicated as I, II, III and IV.

When sine wave and cosine wave currents flow in the X-type and Y-type coils of the drive coils 123 and 124, a rotating magnetic field parallel to the magnetic bubble chip surface, as explained with regard to FIGS. 5A to 5D and 7A to 7D is obtained. The direction of rotation of the revolving magnetic field differs, however, depending upon the area I, II, III and IV, as explained with reference to FIGS. 5A to 5D. Thus, for example, if the rotating magnetic field in the areas I and III is a clockwise directional field, as shown in FIG. 12, the rotating magnetic field in the areas II and IV is a counterclockwise directional field, as shown in FIG. 12.

The shifting of the magnetic bubble due to the permalloy pattern formed on the magnetic bubble chips and the rotating magnetic field is explained in FIGS. 13A, 13B and 13C. FIGS. 13A and 13B show the directions of shifting of the magnetic bubble D when the clockwise rotating magnetic field HR and the counterclockwise rotating magnetic field Hr', respectively, act on the magnetic bubble chip having a Permalloy pattern of the same shape.

As shown in FIG. 13A, when the clockwise rotating magnetic field acts, the magnetic bubble D shifts in the direction of an arrow A, that is, to the right, as explained with regard to FIGS. 1A to 1D. On the other hand, as shown in FIG. 13B, when the counterclockwise rotating magnetic field acts, the magnetic bubble D shifts in the direction of an arrow B, that is, to the left.

The sequence of the magnetic poles produced at the Permalloy pattern according to the direction of rotation of the rotating magnetic field is reversed in the examples of FIGS. 13A and 13B. That is, as shown in FIG. 13A, when the clockwise rotating magnetic field is applied to a magnetic bubble chip having a Permalloy pattern, of the same shape, the magnetic bubble D is produced by a magnetic bubble producing device 131 and is shifted to the right, that is, in a positive direction. On the other hand, as shown in FIG. 13B, when the counterclockwise rotating magnetic field is applied, the magnetic bubble D is shifted to the left, towards the magnetic bubble producing device 131, that is, in a negative direction.

Generally, in mass production of a magnetic bubble chip, it is considered that the means of evaporating the same shaped Permalloy pattern is suitable from the points of view of quality control and working efficiency. Therefore, as shown in the areas I, II, III and IV of FIG. 12, if a magnetic bubble chip having a Permalloy pattern of the same shape is provided in a position where the direction of rotation of each rotating magnetic field is different, the direction of shifting of the magnetic bubble is positive or negative depending upon the magnetic bubble chips. That is, normal operation is not attainable.

When a magnetic bubble chip having the Permalloy pattern shown in FIG. 13B is reversed symmetrically with respect to a line F, the magnetic bubble shown in FIG. 13C may be obtained. Moreover, when the counterclockwise rotating magnetic field HR' acts on the magnetic bubble of FIG. 13C, the magnetic bubble D shifts in the direction of an arrow C. This direction is opposite that of FIG. 13B, that is, it is the positive direction, as in FIG. 13A.

FIG. 14 illustrates still another embodiment of the magnetic bubble device of the invention. In FIG. 14, magnetic bubble chips 145a, 145b, 145c and 145d are positioned in the areas II and IV on the surfaces of the magnetic bubble plates 142 and 141, respectively, facing each other. Two flat faced coils of X-type and Y-type are combined as drive coils 143 and are positioned on the surface of the magnetic bubble plate 141 farthest from the magnetic bubble plate 142. Two other flat faced coils of X-type and Y-type are combined as drive coils 144 and are positioned on the surface of the magnetic bubble plate 142 farthest from the magnetic bubble plate 141.

The magnetic bubble plates 141 and 142 are juxtaposed by rotation about a line G in the directions of arrows K and L, respectively. Consequently, the front and the rear surfaces of the magnetic bubble chips, or the surfaces thereof facing each other and the surfaces thereof farthest from each other, positioned in the areas I and III, and II and IV where the directions of rotation of each rotating magnetic field shown in FIGS. 13A to 13C are different, face each other, whereby the magnetic bubble of each magnetic bubble chip may shift in the positive direction. In other words, in the areas I and III, where the rotating magnetic field acts clockwise, the Permalloy pattern on the magnetic bubble chip has the relation shown in FIG. 13A, and in the areas II and IV, where the rotating magnetic field acts counterclockwise, the Permalloy pattern on the magnetic bubble chip has the relation shown in FIG. 13C.

As is clear from the aforedescribed embodiments, the magnetic bubble device of the invention using a flat faced coil, consisting of a conductor wound flat, as the drive coil, has the advantages that generated heat is discharged or radiated from the device successfully, sufficient area is provided for drawing out input and output and control leads from the magnetic bubble chips and assembly of the device is facilitated in mass production.

While the invention has been described by means of specific examples and in specific embodiments, we do not wish to be limited thereto, for obvious modifications will occur to those skilled in the art without departing from the spirit and scope of the invention.

We claim:

1. A magnetic bubble device having a plurality of magnetic bubble chips each consisting of magnetic material for producing a magnetic bubble under the effect of a bias magnetic field, each of said magnetic bubble chips having a surface, said magnetic bubble device comprising, a plurality of drive coils for producing a rotating magnetic field substantially parallel to the surfaces of the magnetic bubble chips, said plurality of drive coils including a flat faced coil consisting of electrically conductive material having flat windings, said flat faced coil producing a magnetic field substantially in its own plane, each of the magnetic bubble chips being positioned in a corresponding one of a plurality of areas where each direction of rotation of the magnetic field produced by the drive coils and acting on the magnetic bubble chip is different, selected ones of the magnetic bubble chips being positioned in areas where the rotating magnetic field acts clockwise and selected others of the magnetic bubble chips being positioned in areas where the rotating magnetic field acts counterclockwise, said ones of the magnetic bubble chips and said others of the magnetic bubble chips being in juxtaposition whereby the magnetic bubble produced by each of the magnetic bubble chips is shiftable in a positive direction.

2. A magnetic bubble device having a magnetic bubble chip consisting of magnetic material for producing a magnetic bubble, said magnetic bubble chip having a surface, said magnetic bubble device comprising, drive coil means for producing a rotating magnetic field substantially parallel to the surface of the magnetic bubble chip, said drive coil means including a flat faced coil consisting of electrically conductive material having flat windings, said flat faced coil producing a magnetic field substantially in its own plane, and said magnetic bubble chip being positioned in the magnetic field produced by said flat faced coil, said drive coil means comprising a pair of flat faced coils in substantially parallel planes and crossing each other; and a conductive plate of electrically conductive material substantially parallel to the flat faced coils and in facing relation therewith, said magnetic bubble chip being positioned between the flat faced coils and the conductive plate.

* * * * *